United States Patent [19]

van Tran

[11] Patent Number: 4,621,208

[45] Date of Patent: Nov. 4, 1986

[54] CMOS OUTPUT BUFFER

[75] Inventor: Hiep van Tran, Carrollton, Tex.

[73] Assignee: Thomson Components - Mostek Corporation, Carrollton, Tex.

[21] Appl. No.: 647,970

[22] Filed: Sep. 6, 1984

[51] Int. Cl.[4] ................ H03K 19/017; H03K 19/094; H03K 19/20; H03K 17/693

[52] U.S. Cl. .................... 307/473; 307/443; 307/451; 307/585; 307/270

[58] Field of Search ................ 307/270, 247 R, 451, 307/475, 473, 585, 449, 463, 443

[56] References Cited

U.S. PATENT DOCUMENTS

| | | | |
|---|---|---|---|
| 4,280,065 | 7/1981 | Minato et al. | 307/473 |
| 4,300,213 | 11/1981 | Tanimura et al. | 307/449 X |
| 4,363,978 | 12/1982 | Heimbigner | 307/473 X |
| 4,491,749 | 1/1985 | Iwamura | 307/473 |
| 4,540,904 | 9/1985 | Ennis et al. | 307/473 |

FOREIGN PATENT DOCUMENTS

| | | | |
|---|---|---|---|
| 154942 | 9/1982 | Japan | 307/473 |
| 181231 | 11/1982 | Japan | 307/473 |
| 209225 | 12/1983 | Japan | 307/473 |

OTHER PUBLICATIONS

Griffin et al., "High Speed Complementary Driver Circuit"; *IBM-TDB*; vol. 24, No. 5, pp. 2558–2559; 10/1981.

*Primary Examiner*—Larry N. Anagnos
*Attorney, Agent, or Firm*—Roland Plottel

[57] ABSTRACT

A synchronizing buffer arrangement for a CMOS memory with output drive transistors receiving one of a pair of input data signals, and being subject to the pull-up and pull-down support of the other of said data signals.

3 Claims, 2 Drawing Figures ial Field
CMOS OUTPUT BUFFER

DESCRIPTION

1. Technical Field

This invention relates to the art of CMOS output buffers, and more particularly to CMOS output buffers having symmetric data inputs and CMOS output drive transistors.

2. Background Art

As is well known, CMOS memory IC output voltages ranging between $V_{ss}$ (ground) and $V_{cc}$ are effectively achievable by employing CMOS transistors as the output drive transistors of the memory IC.

According to such an arrangement of the prior art, symmetric data is applied to a CMOS output buffer along inversion data line designated DATA and DATA'. An enable signal OE controls the application of the DATA and DATA' signals through associated OR gates to respective output drive transistors.

In this arrangement, an inverter changes the state of one of the DATA and DATA' signals to the output drive transistors; one of them being p-channel, and the other being n-channel.

This, of course, introduces a delay in one of the data signals, which permits the establishment of an undesired surge or "crowbar" current through the output transistors when both are turned on. In particular, the inverter of the prior art significantly slows down the data signal to the p-channel transistor, permitting both output transistors to be "on" for a finite period of time, and thus detrimentally drawing an excessive amount of current.

Moreover, not only does this prior art arrangement draw excessive current, the overall arrangement is slowed to the speed of the delayed one of the two data signals.

DISCLOSURE OF INVENTION

According to the invention, a faster output buffer drawing less current than comparable arrangements of the prior art is established for operation with CMOS memories. The buffer features enabling NAND and NOR gate circuitry as well as pull-up and pull-down transistors for accelerated response to drive the output transistors thus insuring the in-phase synchronized arrival of both data signals at their respective output transistor gate, thereby effectively preventing a crowbar current condition.

BEST MODE FOR CARRYING OUT THE INVENTION

Figure 1:
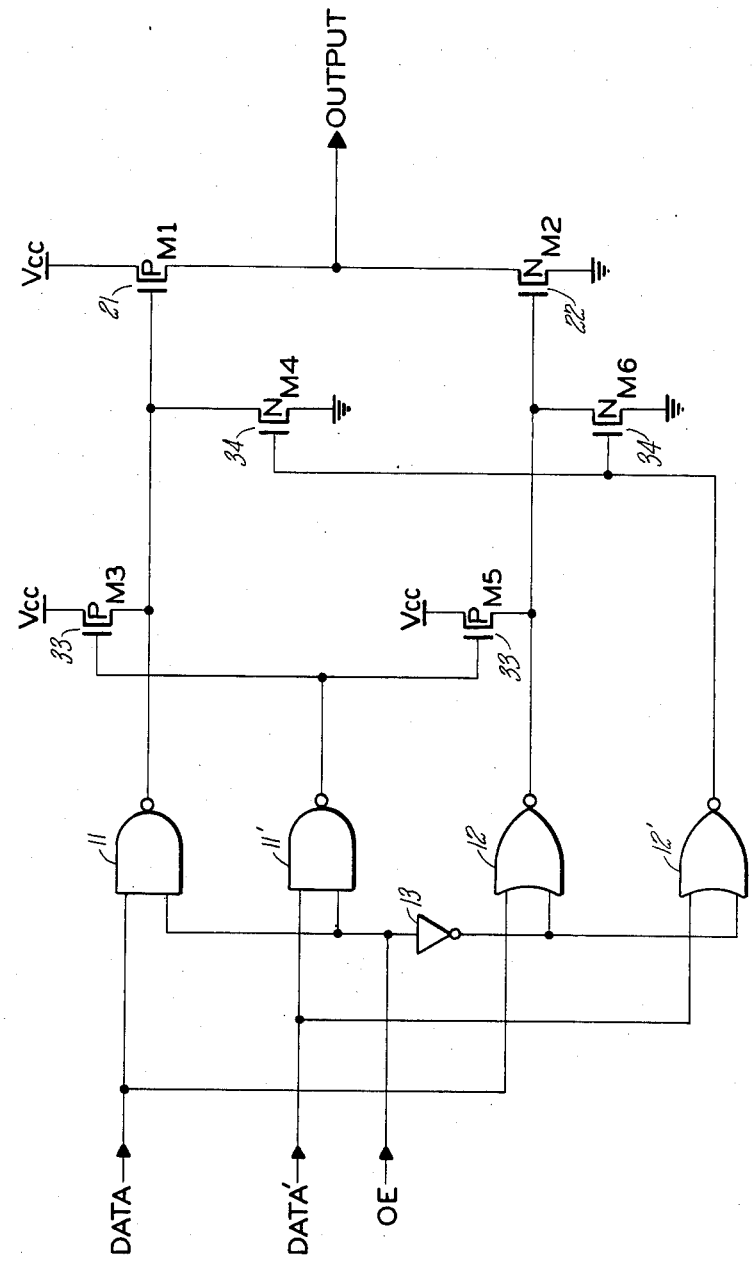
FIG. 1 is a schematic of the synchronizing buffer circuit according to the invention herein.

FIG. 1 of the Drawing shows output CMOS memory signals DATA and DATA', the first being inverted with respect to the second and vice versa. The DATA signal is connected to NAND and NOR gates 11 and 12, and directly drives respective output transistors M1 and M2, designated 21 and 22, under control of enable signal OE.

Respective pairs of pull-up/pull-down transistors 33 and 34 control the gates of output CMOS transistors 21 and 22. One pair of transistors 33, 34 is driven through NAND gate 11' and the other through NOR gate 12'. This permits the enable signal OE to establish a turn-off condition at the respective gates of transistors 21 and 22. This occurs, in particular, when transistor 21 is driven high and transistor 22 is driven low at their respective gates.

DATA' drives pull-up transistors 33 through NAND gate 11', and drives pull-down transistors 34 through NOR gate 12'. Inverter element 13 inverts the OE signal to NOR gates 12 and 12'. These gates effectively turn off the drive transistors 21 and 22 by applying a high signal, i.e. "1", to the gate of transistor 21 and a low signal, i.e. "0", to the gate of transistor 22.

It follows that when DATA and DATA' are respectively set high and low with OE set high, the gates to drive transistors 21 and 22 will both be subject to logic low signals producing a combined high output indication not subject to delay on either channel.

The achievement of the selected level at gates 21 and 22 is accelerated by the contribution of pull-up and pull-down transistors 33 and 34, in particular by DATA' acting through respective NAND and NOR gates 11' and 12'.

Even more particularly, with DATA' at logic low, the pull-up and pull-down gate nodes of transistors 33 and 34 will each be at logic high, effectively producing the desired logic low level at the outputs of transistors 21 and 22. This supports and accelerates the establishment of the logic levels directly induced by the DATA signal acting through NAND and NOR gates 11 and 12.

Inverter 13 is employed for establishing a suitable enable signal to NOR gates 12 and 12'. It does not delay the signal driving output transistors 21 and 22, as in the prior art, however.

Figure 2:
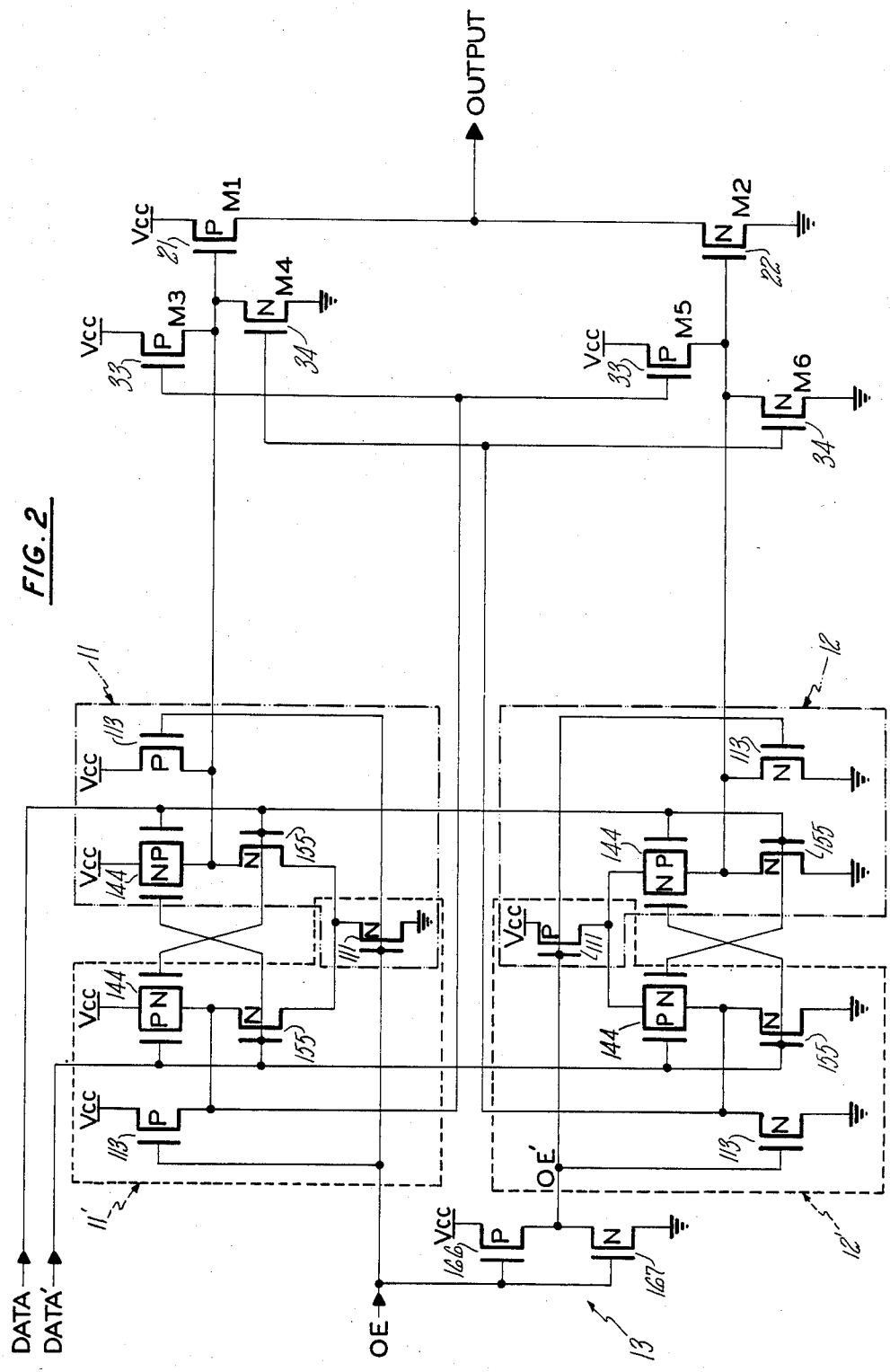
FIG. 2 is an even more detailed drawing of a preferred transistor circuitry for implementing the buffer according to one version of the invention.

FIG. 2 shows how the arrangement in FIG. 1 can be implemented in terms of actual transistor components according to a preferred mode of the invention. Output transistors 21 and 22, as well as pull-up and pull-down transistors 33 and 34, are shown as before.

NAND gates 11 and 11' share a common n-channel enable transistor 111. The enable signal OE is connected to transistors 113. DATA and DATA' inputs are provided respectively to the p-gate and n-gate of parallel gate transistors 144, as well as to the respective gates of n-channel transistors 155.

Series respective p- and n-channel transistors 166 and 167 established between $V_{cc}$ and ground are connected as an inverter 13 leading to NOR gates 12 and 12' which in turn shares a common p-channel enable transistor 111. The inverted enable signal OE' is also provided to the gates of other enable transistors 113, which in this case are n-channel devices. As before, DATA and DATA' inputs are provided respectively to the p-gate and n-gate of parallel gate transistors 144, as well as to the respective gates of n-channel transistors 155.

The above information may lead others skilled in the art to conceive of other versions of the concepts addressed herein, which are nonetheless within the scope of the invention. It is accordingly urged that reference be made to the claims which follow, as these set forth with particularity the metes and bounds of the invention.

I claim:

1. A complementary drive circuit comprising: means supplying a pair of complementary signals, first and second NAND circuits, first and second NOR circuits, one of the complementary signals being applied as an input to each of the first NAND and first NOR circuits, the other of the complementary signals being applied as an input to each of the second NAND and second NOR circuits, means supplying an enable pulse as an input to each of the first and second NAND circuits and its complement to each of the first and second NOR circuits, first and second complementary serially connected output drive transistors, the output of the first NAND circuit being supplied as the input to the first drive transistor, and the output of the first NOR circuit being supplied as the input to the second drive transistor, a pair of pull-up transistors, and a pair of pull down transistors, the first of each being associated with the first output transistor and the second of each with the second output transistor, the output of the second NAND circuit being supplied as the input to each of the pull up transistors and the output of the second NOR circuit being supplied on the input to each of the pull down transistors, and means for obtaining the output signal from the node between the serially connected output drive transistors.

2. The complementary driver circuit of claim 1 in which each of the NAND and NOR circuits are of the CMOS type.

3. The complementary circuit of claim 1 in which the first and second NAND circuits and the first and second NOR circuits cooperate to provide that each of the complementary inputs to the first and second output transistors are in synchronism.

* * * * *